United States Patent [19]
Yung et al.

[11] Patent Number: 5,895,480
[45] Date of Patent: Apr. 20, 1999

[54] METHOD OF AND MEANS FOR ACCESSING AN ADDRESS BY RESPECTIVELY SUBSTRACTING BASE ADDRESSES OF MEMORY INTEGRATED CIRCUITS FROM AN ACCESS ADDRESS

[75] Inventors: Wu Chi Yung; Kuo Cheng Yu, both of Hsin Chu, Taiwan

[73] Assignee: Holtek Microelectronics, Inc., Hsin Chu, Taiwan

[21] Appl. No.: 08/541,600

[22] Filed: Oct. 10, 1995

[51] Int. Cl.$^6$ ................................. G06F 12/06
[52] U.S. Cl. ........................ 711/5; 711/2; 711/170; 711/202; 711/211; 365/230.01
[58] Field of Search .............. 365/230.03, 230.01; 395/405, 497.02; 711/5, 171, 170, 2, 202

[56] References Cited

U.S. PATENT DOCUMENTS

| | | | |
|---|---|---|---|
| 4,839,856 | 6/1989 | Tanaka | 711/211 |
| 4,979,144 | 12/1990 | Mizuta | 711/115 |
| 4,984,213 | 1/1991 | Abdoo et al. | 365/230.03 |
| 5,016,226 | 5/1991 | Hiwada et al. | 365/233 |
| 5,040,153 | 8/1991 | Fung et al. | 365/230.03 |
| 5,051,889 | 9/1991 | Fung et al. | 711/157 |
| 5,343,437 | 8/1994 | Johnson et al. | 365/230.03 |
| 5,394,538 | 2/1995 | Wada et al. | 711/171 |
| 5,452,257 | 9/1995 | Han | 365/230.03 |
| 5,619,670 | 4/1997 | Shindo | 711/202 |

*Primary Examiner*—Eddie P. Chan
*Assistant Examiner*—Hong C. Kim
*Attorney, Agent, or Firm*—Laff, Whitesel, Conte & Saret, Ltd.

[57] ABSTRACT

The present invention provides a method for accessing a memory device and a memory accessing device. The method includes a) providing the memory device having a plurality of memory sub-spaces respectively having a plurality of address ranges; b) respectively assigning a plurality of base addresses to the plurality of memory sub-spaces; c) inputting an access address; d) respectively operating the base addresses with the access address to obtain a plurality of operated results; and e) accessing one of the memory sub-spaces if a specific one of the operated results falls within one of the address ranges corresponding to the one memory sub-space. The memory accessing device includes an access address end, a data access end, an access selection end, a memory device having a plurality of memory sub-spaces, and a plurality of access devices respectively electrically connected to the memory sub-spaces, and each of which includes a base address storing device for storing therein a base address, an operating and comparing device for operating the access address with the base address to obtain an operated result and generating a data access enabling signal when the operated result falls within an address range, and a data buffer for accessing the respective memory sub-space in response to the data access enabling signal and the access selection signal.

16 Claims, 15 Drawing Sheets

METHOD OF AND MEANS FOR ACCESSING AN ADDRESS BY RESPECTIVELY SUBSTRACTING BASE ADDRESSES OF MEMORY INTEGRATED CIRCUITS FROM AN ACCESS ADDRESS

FIELD OF THE INVENTION

The present invention relates to a method for accessing a memory device and also to a memory accessing device.

BACKGROUND OF THE INVENTION

At present, there are two ways, i.e. in series and in parallel for accessing a memory data. Taking the former one for example, as shown in FIG. 1, the relevant block diagram includes an input register 11, a decoding memory unit 12 for storing therein data to be accessed, and an output register 13 in the same integrated circuit (IC) package having AIN, DOUT, CLK and $\overline{CS}$ pins. Also referring to FIG. 2, the accessing operation in series is described as follows:

When the $\overline{CS}$ pin is LOW, IC 10 is enabled so that CLK pin receives a clock signal and pin AIN receives an address signal. If an address in decoding memory unit 12 has 14 bits, pin AIN will receive a bit each time in series 14 address signals A0–A13 which are outputted by input register 11 after having sequentially received address signals A0–A13. After address signals A0–A13 have been received and decoded by decoding memory unit 12, decoding memory unit 12 outputs data D0–D7 corresponding to address signals A0–A13 to output register 13 outputting in turn a bit at one time data D0–D7 in series from pin DOUT. The advantage of this accessing way resides in that the interface circuit for accessing decoding memory unit 12 only requires an address pin and a data output pin. Accordingly, when the memory capacity of decoding memory unit 12 is desired to be expanded, what is needed is to increase the bit numbers of the input addresses or to externally connect to decoding memory unit 12 a plurality of identical IC packages 10 without the necessity of changing the pin number of the IC package 10.

When the required memory capacity exceeds the maximum capacity of a single memory, an external decoder in addition to the connection of plural identical IC packages 10 is needed for distinguishing among identical memories, as shown in FIG. 3 which shows an expanded memory 30 which includes pins AN, DOUT, CLK and $\overline{CS}$ and 4 memories 31–34 respectively including pins AIN1–AIN4, DOUT1–DOUT4, CLK1–CLK4 and $\overline{CS1}$–$\overline{CS4}$. It can be seen that a 2-to-4 decoder 35 needs two extra signal wires EXT0 and EXT1. If an even larger capacity of memory 30 is desired, additional decoders and signal wires are conceivably to be required which will inevitably complicate the relevant circuit design.

To access a memory data in parallel is exemplarily shown in FIG. 4 showing a decoding memory unit 4 which receives and then decodes at the same time 14 address signals A0–A13, then outputs at the same time data corresponding to address signals A0–A13, and thus requires 14 address pins PA0–PA13 and 8 data output pins PD0–PD7. It can be found that decoding memory unit 4 also includes a chip selection pin CS and an output enabling pin OE. FIG. 5 shows timing signals of pins shown in FIG. 4. The advantage of parallelly accessing the memory data is the fast accessing speed since every bit address and data are respectively received and outputted from corresponding pins so that a full data can be accessed at a time. Nevertheless, it has disadvantages as follows:

1) Every chip has a great many of pins to result in a relatively high packaging cost.
2) The controller for controlling decoding memory unit 4 must be provided with equal pins for controlling address and data pins of decoding memory unit 4 so that too many controlling pins of the controller are so occupied.
3) If decoding memory unit 4 is to be expanded, its pin number will be significantly increased so that the layout of the peripheral control system needs be newly designed as shown in FIG. 6 showing an expanded parallel memory device 60 which includes pins A0–A5, WR and $\overline{CS}$ and 4 series-connected memories 61–64 respectively having pins A01–A04, A11–A14, A21–A24, A31–A34, A41–A44, A51–A54, WR1–WR4 and $\overline{CS1}$–$\overline{CS4}$. It also can be found that there additionally are a 2-to-4 decoder 65 and two signal wires A6 and A7. If an even larger capacity of memory device 60 is desired, additional decoders and signal wires are conceivably to be required which will inevitably complicate the relevant circuit design.

It is therefore attempted by the Applicant to deal with the problems encountered by the prior art.

SUMMARY OF THE INVENTION

It is therefore an object of the present invention to provide a method for accessing a memory device or a memory accessing device which possesses a memory expanding flexibility without incurring thereto a decoding circuit.

It is therefore another object of the present invention to provide a method or a device by which one can optionally or conveniently access a memory data.

According to the present invention, a method for accessing a memory device includes a) providing the memory device including a plurality of memory sub-spaces respectively having a plurality of address ranges; b) respectively assigning a plurality of base addresses to the plurality of memory sub-spaces; c) inputting an access address; d) respectively operating the base addresses with the access address to obtain a plurality of operated results; and e) accessing one of the plurality of memory sub-spaces if a specific one of the operated results falls within one of the address ranges corresponding to the one memory sub-space.

Certainly, the memory sub-spaces can be equal or unequal in size, and one of the base addresses can be a starting address of the memory device. In accordance with another aspect of the present invention, one of the base addresses corresponding to a specific one of the memory sub-spaces has a value equal to a sum of that of one respective base address corresponding to the respective memory sub-space preceding to the one specific memory sub-space and that of the respective address range corresponding to the preceding memory sub-space. The operated results can be obtained by respectively subtracting the base addresses from the access address.

We can consider that the specific one operated result falls within the one address range if the specific one operated result has a value not smaller than that of the respective base address corresponding to the one memory sub-space and not larger than a sum of that of the respective base address and that of the one address range.

Alternatively, a method for accessing a memory device can include a) providing the memory device including a plurality of memory sub-spaces respectively having a plurality of address ranges; b) respectively assigning a plurality of base addresses to the plurality of memory sub-spaces; c)

inputting an access address having a low-bit and a high-bit addresses; d) outputting the low-bit address to the memory sub-spaces; e) respectively operating the base addresses with the high-bit address to obtain a plurality of operated results; and f) accessing one of the plurality of memory sub-spaces if a specific one of the operated results is not larger than a high-bit of a value of one of the address ranges corresponding to the one memory sub-space.

According to the present invention, the memory accessing device includes an access address end, a data access end, an access selection end, a memory device having a plurality of memory sub-spaces, and an access means for determining which one of memory sub-spaces could or should be accessed. Preferably the access means includes a plurality of access devices each of which includes a base address storing means for storing therein a base address, an operating and comparing means for operating the access address with the base address to obtain an operated result and generating a data access enabling signal when the operated result falls within an address range, and a data buffer for accessing the respective memory sub-space in response to the data access enabling signal and the access selection signal.

Certainly, the base address storing means can be a base address register, the operating and comparing means can include a subtracter and a comparator, and the operation executed by the operating and comparing means can be a subtraction.

In one instance, the address range covers address limits respectively being initial and final addresses of the respective memory sub-space, and the operated result will fall within the address range when the operated result has a value not smaller than that of the initial address and not larger than that of the final address.

Certainly, the data buffer can be a bidirectional data buffer, and the each access device further includes an address buffer for first receiving the access address and then outputting the access address to the operating and comparing means.

In a second instance, the access address includes a high-bit and a low-bit addresses and the each access device further includes an address buffer for first receiving the access address, and then outputting the low-bit address to the respective memory space and the high-bit address to the operating and comparing means. The address buffer can include two registers for respectively transmitting therethrough low-bit and high-bit addresses.

Certainly, the address range can cover high-bit address limits being initial and final high-bit addresses of the respective memory sub-space, and the operated result falls in the address range when the operated result has a value not smaller than that of the initial high-bit address and not larger than that of the final high-bit address.

Of course, the each access device and the respective memory sub-space can be formed in an integrated circuit.

The present invention may best be understood through the following description with reference to the accompanying drawings, in which:

DETAILED DESCRIPTION OF THE PREFERRED EMBODIMENTS

Figure 1:
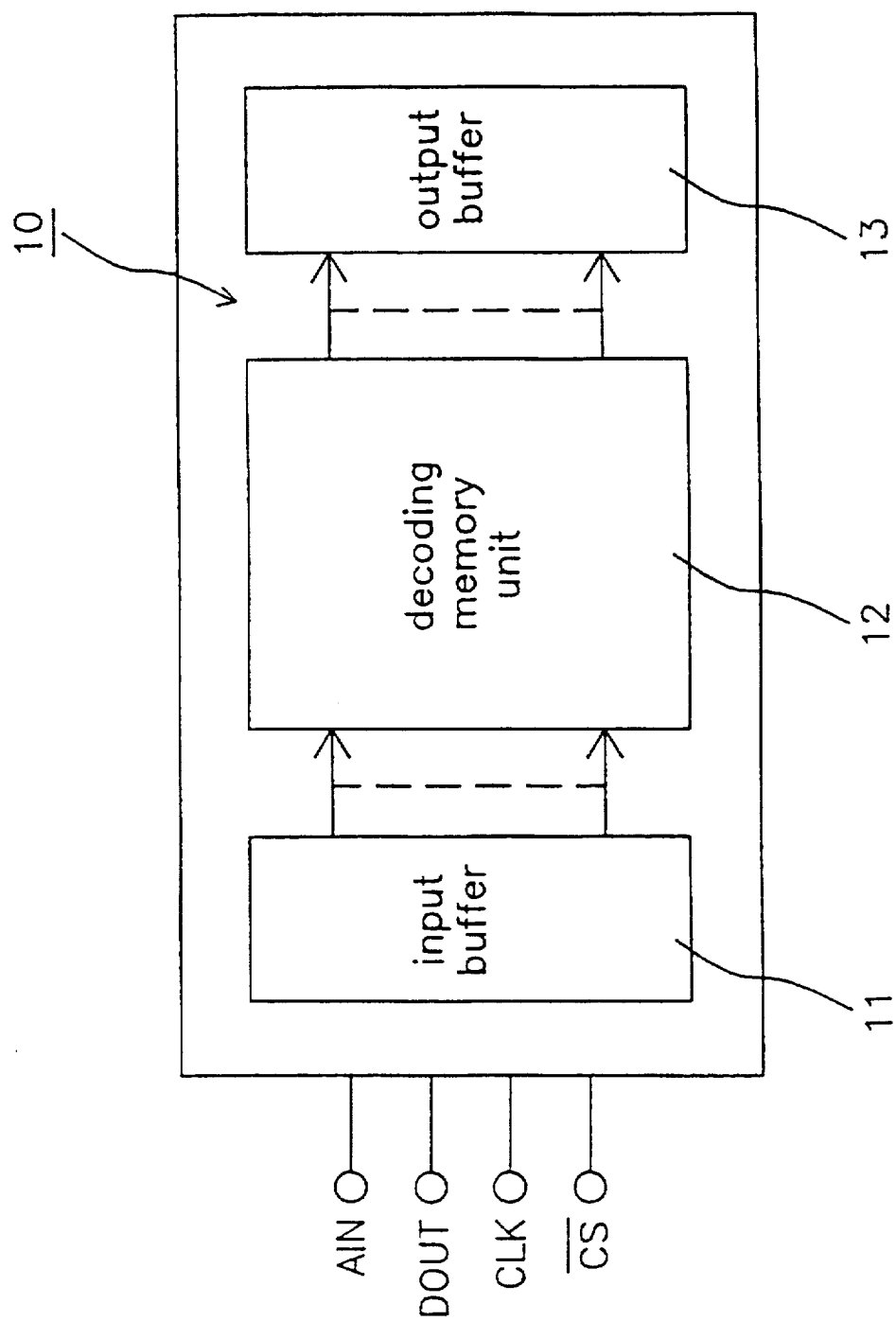
FIG. 1 is a schematic view showing a block diagram of a conventional series-memory accessing device.
Figure 2:
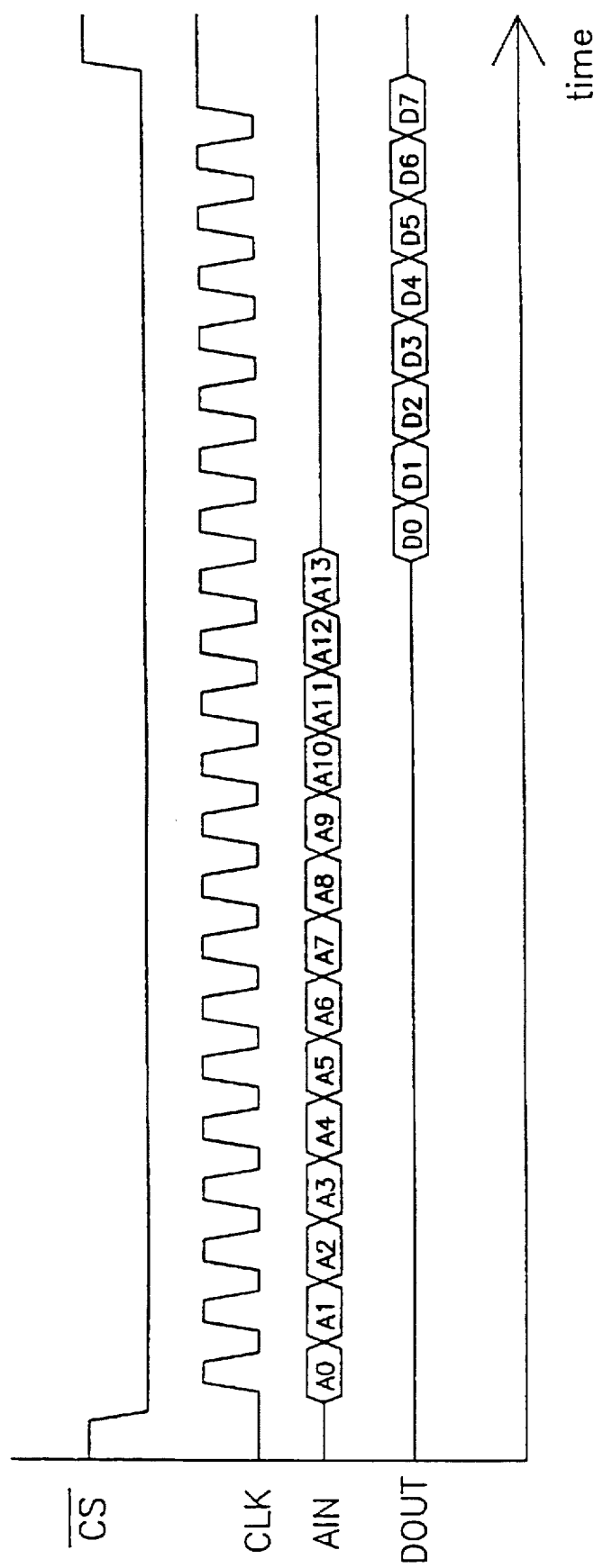
FIG. 2 shows timing sequences for pins of the interface circuit of the device in FIG. 1.
Figure 3:
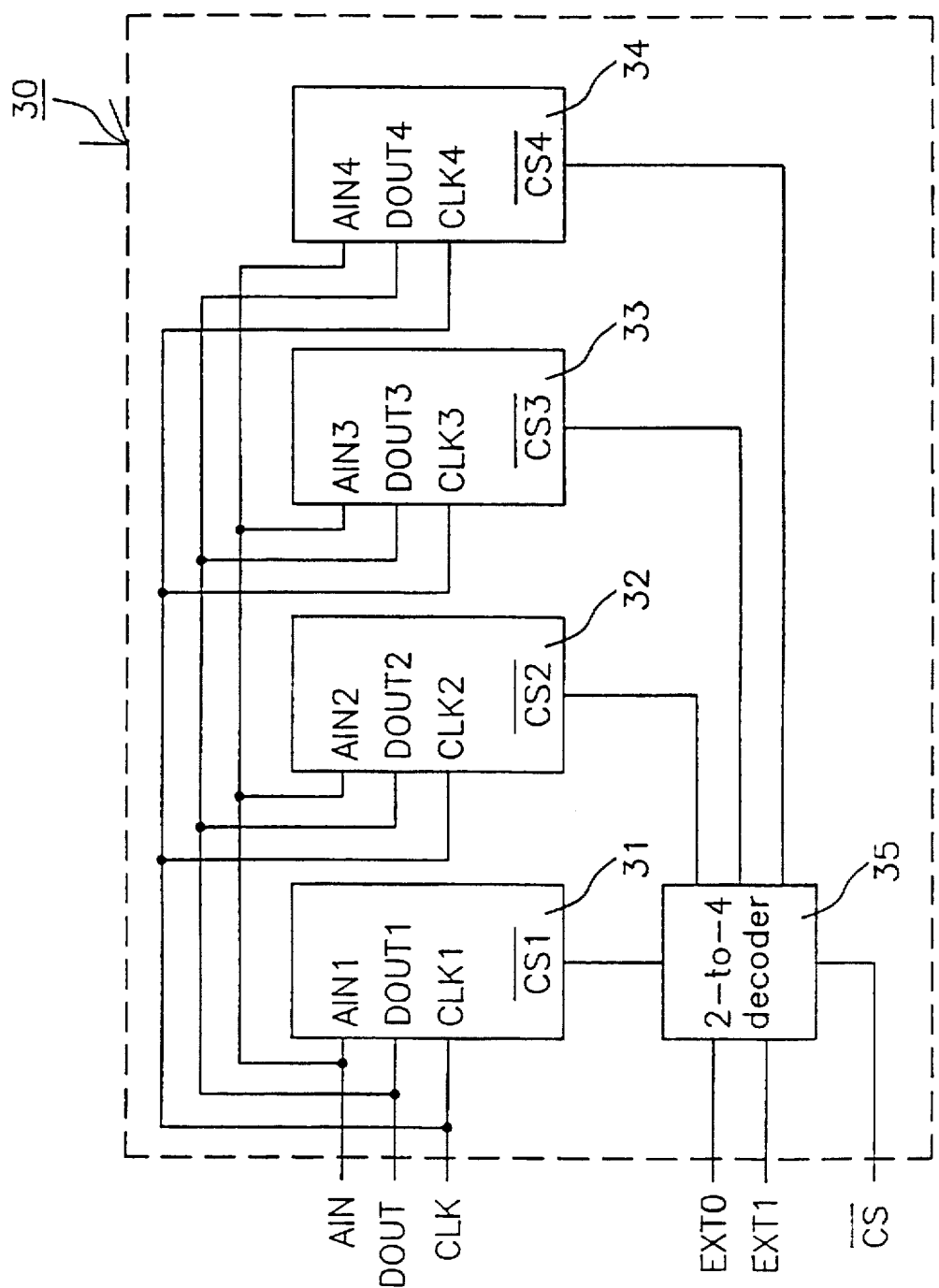
FIG. 3 is a block diagram showing a conventional series-connected expanded memory device.
Figure 4:
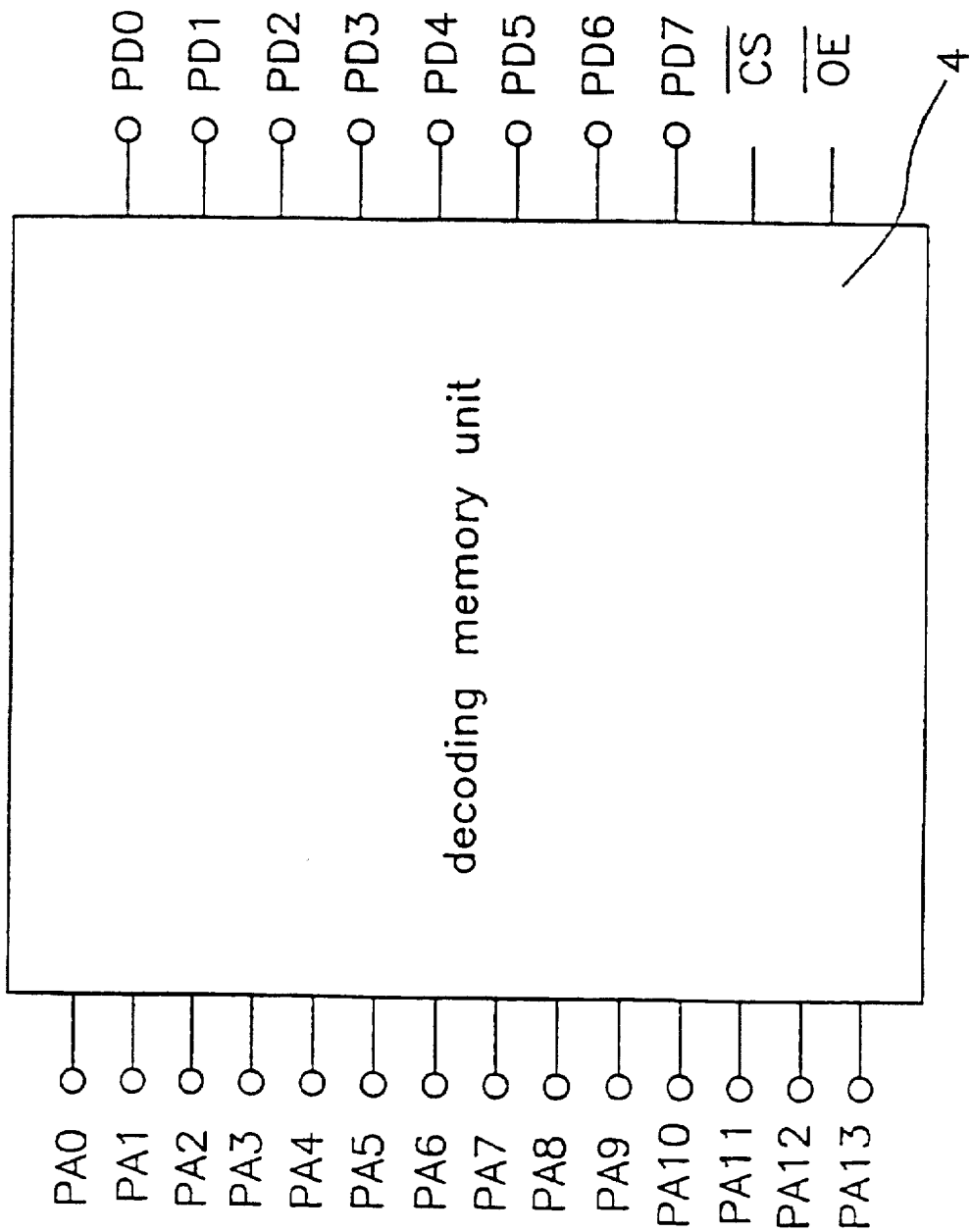
FIG. 4 is a schematic block diagram showing a conventional parallel memory device.
Figure 5:
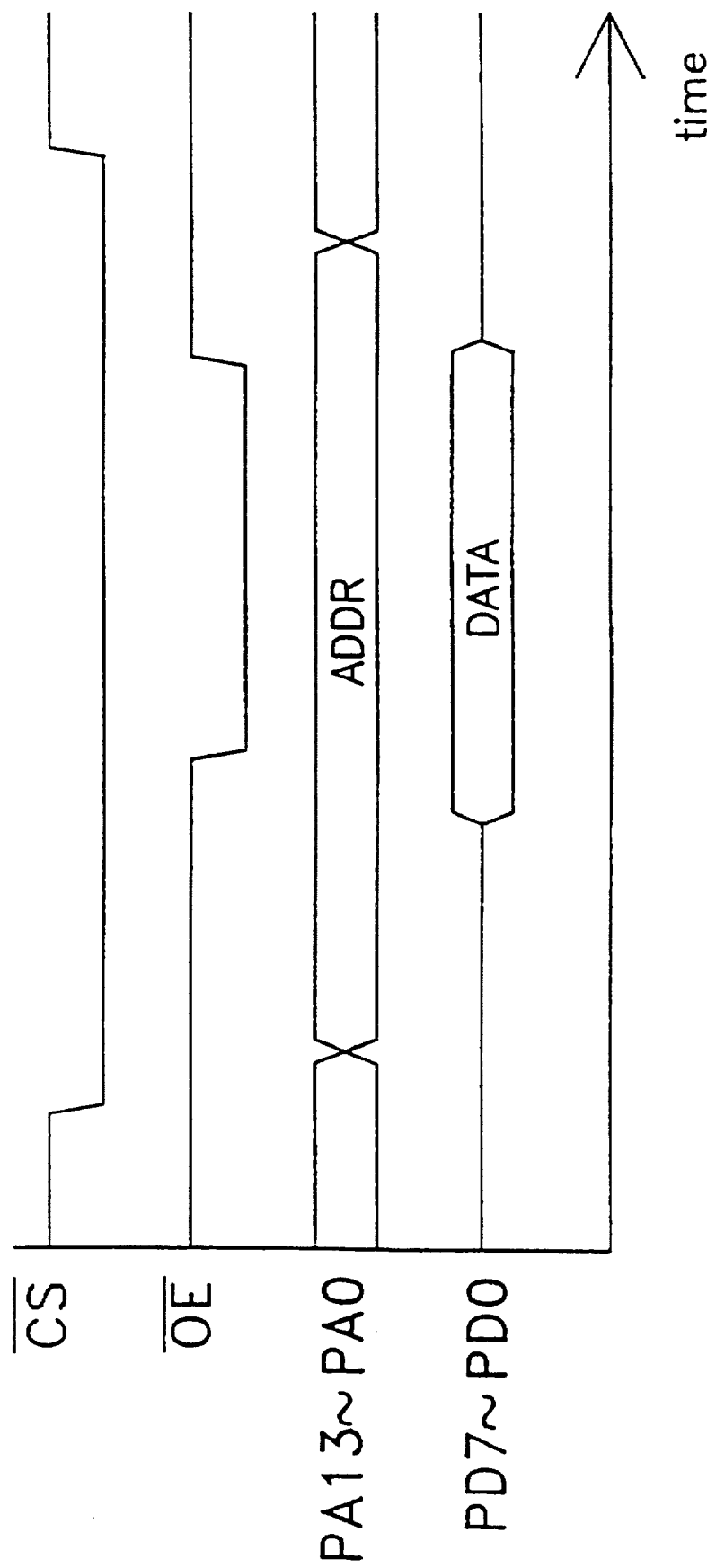
FIG. 5 shows timing sequences for pins of the interface circuit of the device in FIG. 4.
Figure 6:
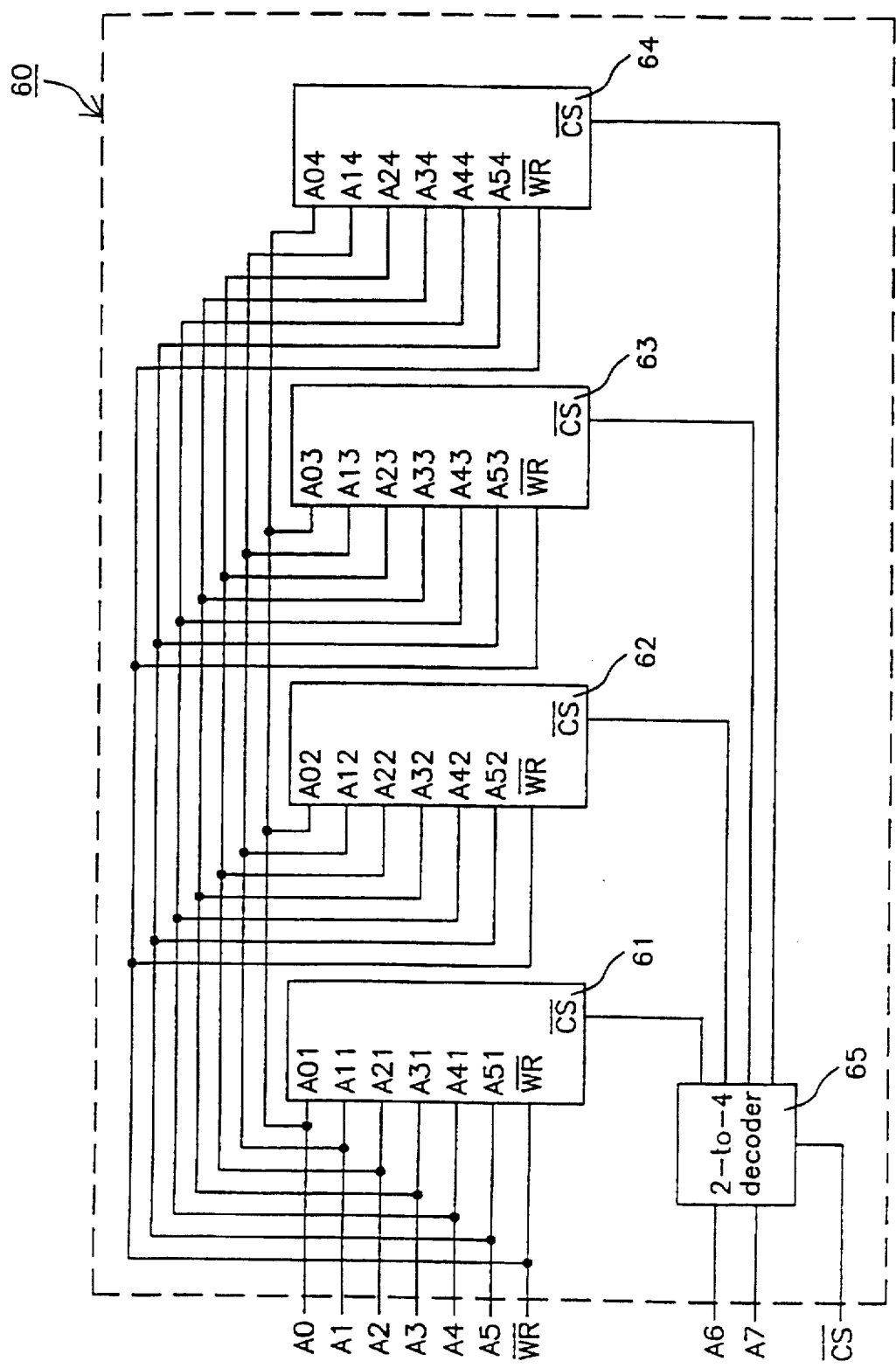
FIG. 6 is a block diagram showing a conventional parallel expanded memory device.
Figure 7:
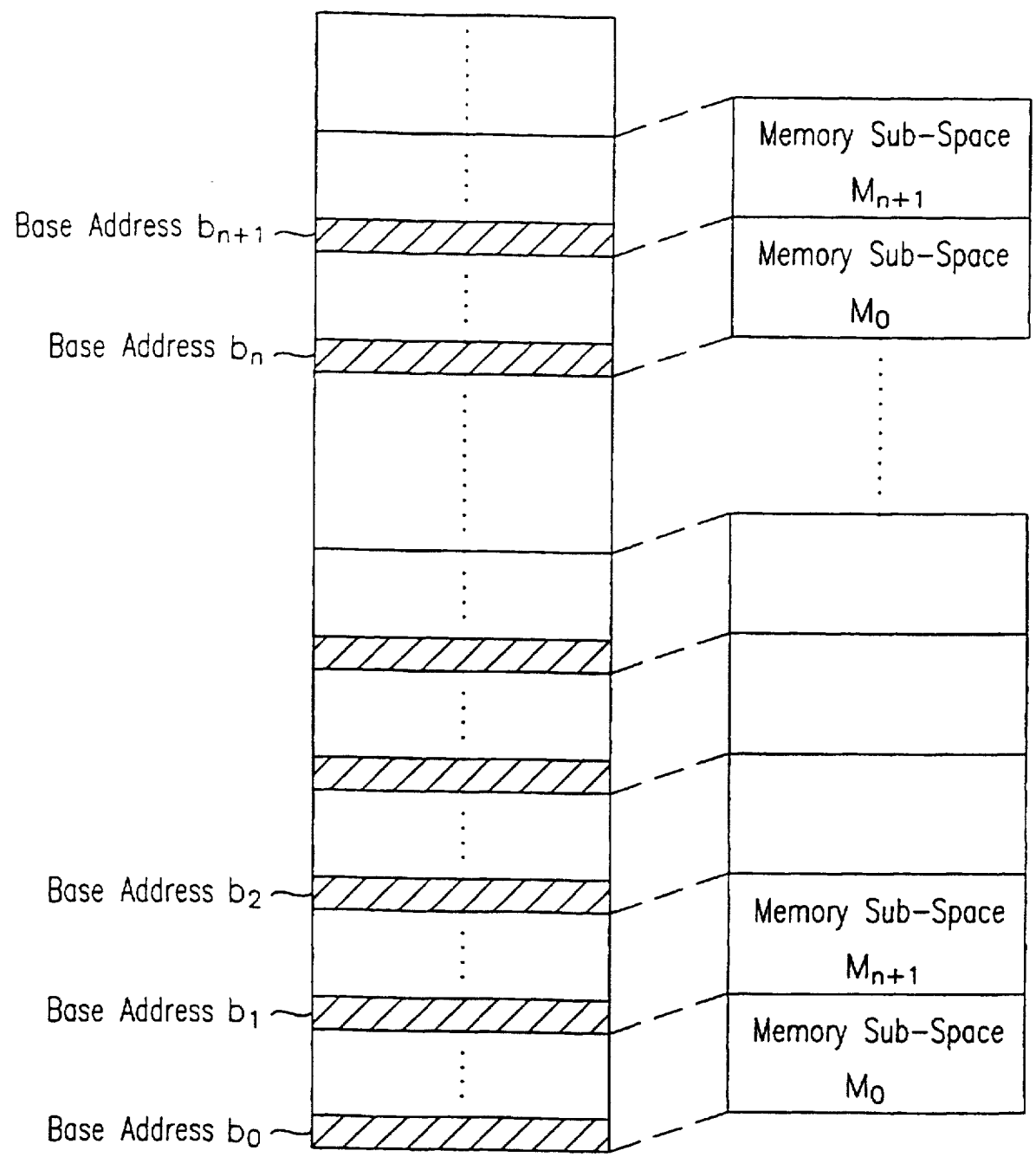
FIG. 7 is a schematic view showing a concept for implementing the present invention.

Referring now to FIG. 7, a memory device having a memory capacity m is divided into a plurality of memory sub-spaces $M_0, M_1, M_2 \ldots M_n, M_{n+1} \ldots$ respectively having base addresses $b_0, b_1, b_2 \ldots b_n, b_{n+1} \ldots$. When there is an input address ranged between base addresses $b_n$, e.g. $b_2$, and $b_{n+1}$, e.g. $b_3$, the corresponding memory sub-space $M_n$, e.g. $M_2$ should be selected to be enabled and accessed. The relative address for a data to be accessed in memory sub-space $M_n$ will equal to the input address minus the base address $b_n$ corresponding to memory sub-space $M_n$. The present invention utilizes the idea that upon manufacturing the relevant memory sub-spaces, corresponding base addresses therefor are respectively stored thereinto in order that the memory sub-spaces can by themselves decide whether an input access address falls within their respective address ranges and accordingly determine whether a specific memory sub-space should be enabled and accessed.

For more clearly understanding the present invention, some more preferred embodiments are discussed below.

Figure 8:
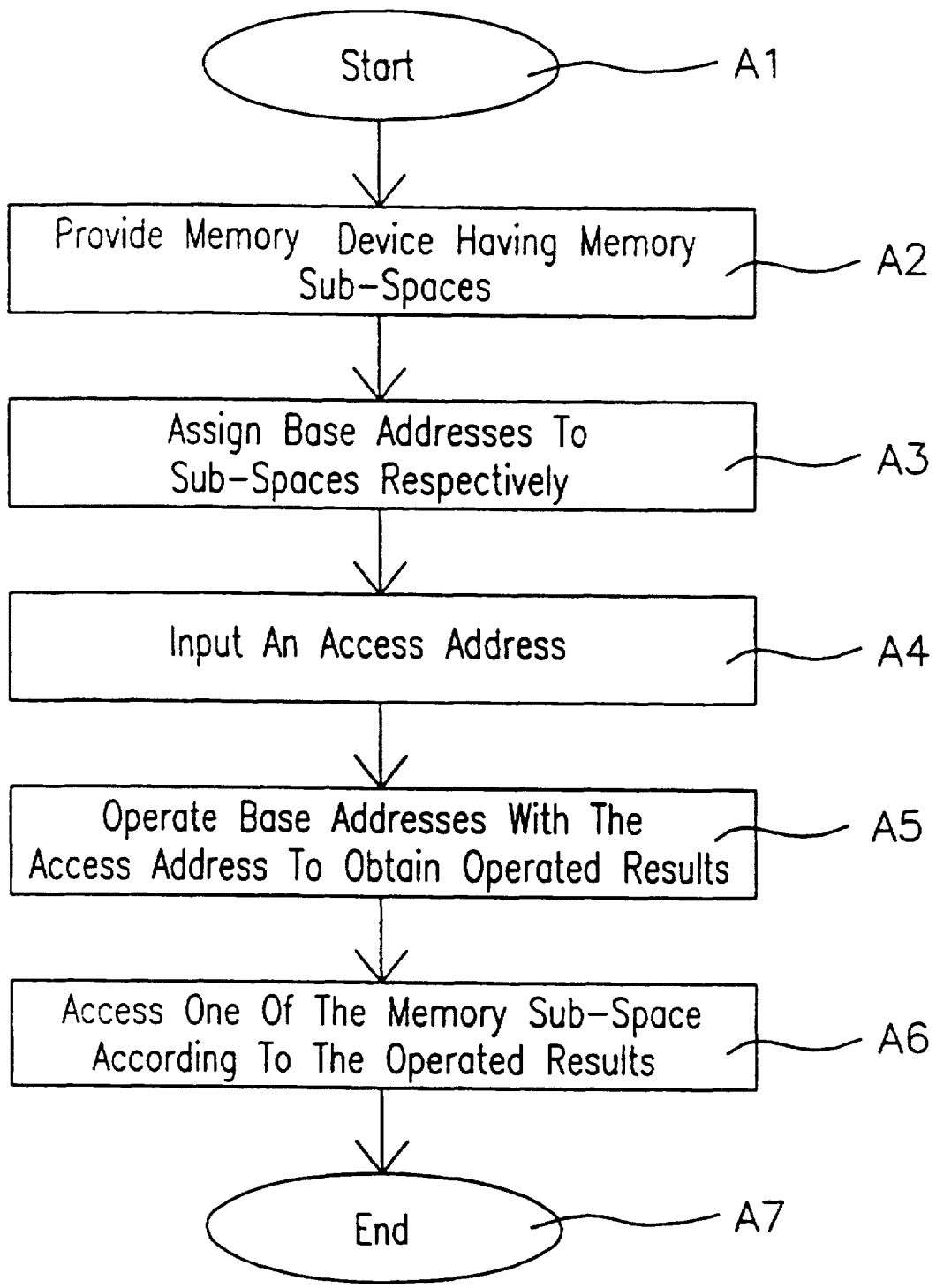
FIG. 8 is a flow chart for illustrating a first preferred embodiment of a method for accessing a memory device according to the present invention.
Figure 9:
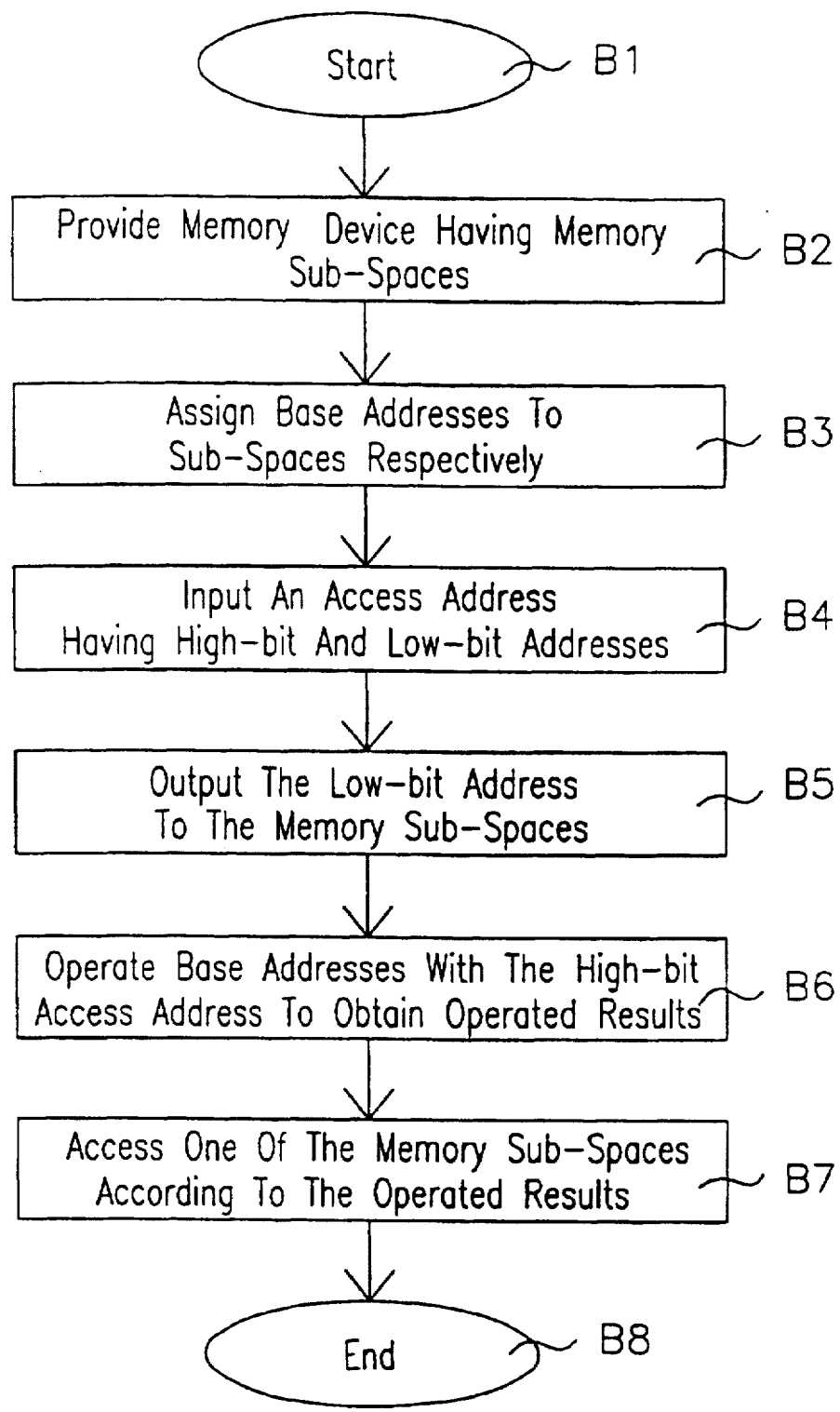
FIG. 9 is a flow chart for illustrating a second preferred embodiment of a method for accessing a memory device according to the present invention.

Referring to FIG. 8, a flow chart of a preferred embodiment of a method for accessing a memory device according to the present invention includes starting A1, providing a memory device having a plurality of memory sub-spaces respectively having a plurality of address ranges being equal or unequal in size A2, respectively assigning a plurality of base addresses to the memory sub-spaces A3 in which the first base address is a starting address of the memory device and one of the base addresses corresponding to a specific one of the memory sub-spaces has a value equal to a sum of that of one respective base address corresponding to the respective memory sub-space preceding to the one specific memory sub-space and that of the respective address range corresponding to the preceding memory sub-space, input an access address A4, respectively operating the base addresses with the access address to obtain a plurality of operated results A5, accessing one of the plurality of memory sub-spaces if a specific one of the operated results falls within one of the address ranges corresponding to the one memory sub-space A6 where the operated results are obtained by respectively subtracting the base addresses from the access address and the specific one operated result falls within the one address range if the specific one operated result has a value not smaller than that of the respective base address corresponding to the one memory sub-space and not larger than a sum of that of the respective base address and that of the one address range, and ending A7. Referring now to FIG. 9, there is shown a flow chart of a second preferred embodiment of a method for accessing a memory device according to the present invention which includes starting B1, providing the memory device including a plurality of memory sub-spaces respectively having a plurality of address ranges B2, respectively assigning a plurality of base addresses to the plurality of memory sub-spaces B3, inputting an access address having a low-bit and a high-bit addresses B4, outputting the low-bit address to the memory sub-spaces B5, respectively operating the base addresses with the high-bit address to obtain a plurality of operated results B6, accessing one of the plurality of memory sub-spaces if a specific one of the operated results is not larger than a high-bit of a value of one of the address ranges corresponding to the one memory sub-space B7, and ending B8.

Figure 10A:
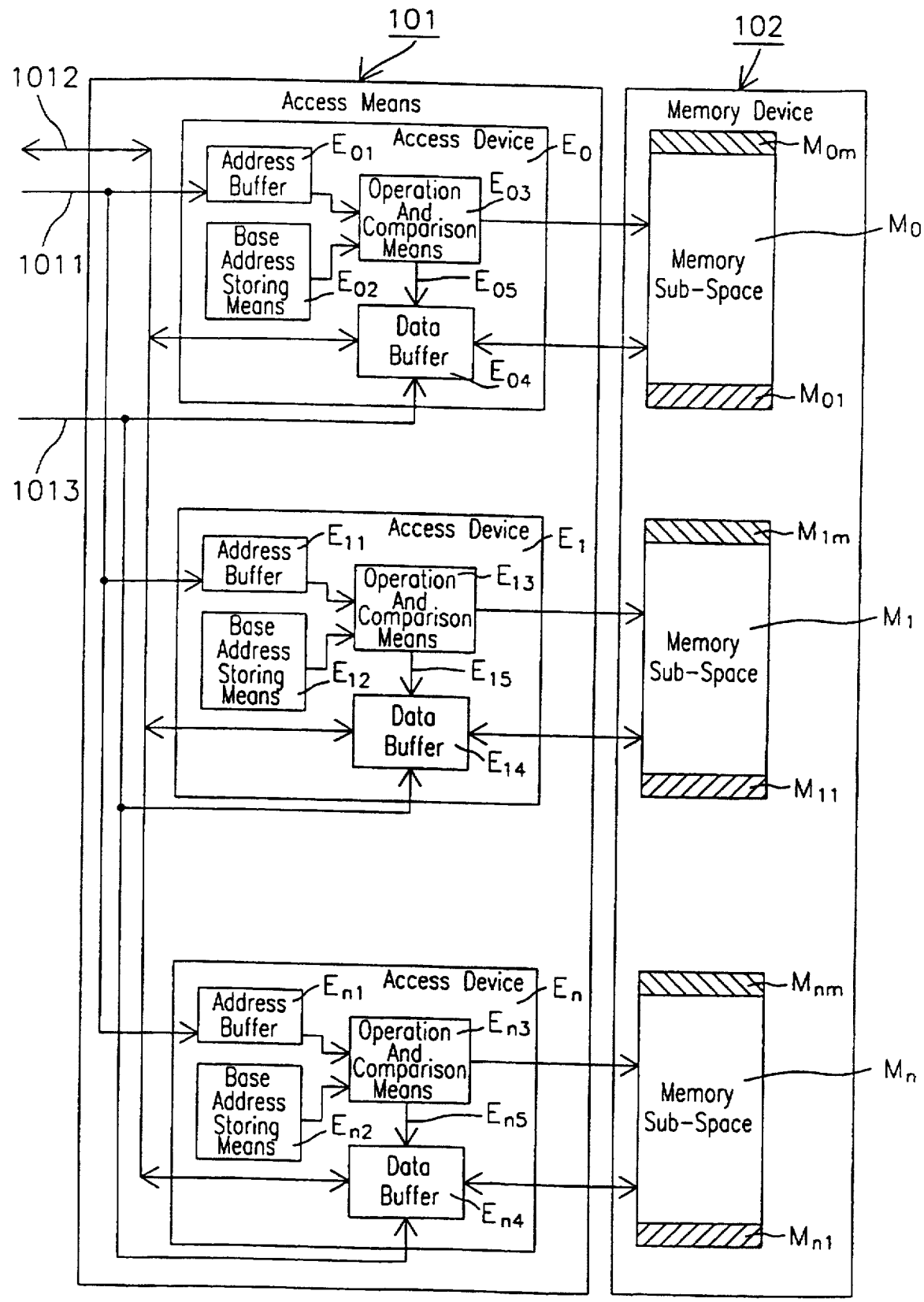
FIG. 10(a) is a schematic view showing a preferred embodiment of a memory accessing device according to the present invention.

Referring now to FIG. 10(a), there is shown a preferred embodiment of a memory accessing device according to the present invention which includes an access address end 1011 to be connected to a central processing unit (CPU) for inputting therethrough an access address, a data access end 1012 to be connected to the CPU, an access selection end 1013 to be connected to the CPU for inputting therethrough an access selection signal, a memory device 102 having a plurality of memory sub-spaces $M_0, M_1 \ldots M_n$ and an access means 101 having a plurality of access devices $E_0, E_1 \ldots E_n$ which are electrically connected to access address end 1011, data access end 1012, access selection end 1013 and memory device 102, respectively electrically connected to the plurality of memory sub-spaces $M_0, M_1 \ldots M_n$ respectively having initial addresses $M_{01}-M_{n1}$ and final addresses $M_{0m}-M_{nm}$, and each of which includes a base address storing means $E_{02}$ (or $E_{12} \ldots$ or $E_{n2}$) being a base address register for storing therein a base address, an operating and comparing means $E_{03}$ (or $E_{13} \ldots$ or $E_{n3}$) including a subtracter and a comparator (not shown) and electrically connected to base address storing means $E_{02}$ (or $E_{12} \ldots$ or $E_{n2}$), access address end 1011 and respective memory sub-space $M_0, M_1 \ldots$ or $M_n$ for operating the access address with the base address to obtain an operated result and generating a data access enabling signal when the operated result falls within an address range, a data buffer $E_{04}$ (or $E_{14} \ldots$ or $E_{n4}$) being a bi-directional data buffer and electrically connected to operating and comparing means $E_{03}$ (or $E_{13} \ldots$ or $E_{n3}$), respective memory sub-space $M_0$ (or $M_1 \ldots$ or $M_n$), data access end 1012 and access selection end 1013 for accessing respective memory sub-space $M_0$ (or $M_1 \ldots$ or $M_n$) in response to the data access enabling signal and the access selection signal, and a an address buffer $E_{01}$ (or $E_{11} \ldots$ or $E_{n1}$) electrically connected to access address end 1011 and operating and comparing means $E_{03}$ (or $E_{13} \ldots$ or $E_{n3}$) for first receiving the access address and then outputting the access address to operating and comparing means $E_{03}$ (or $E_{13} \ldots$ or $E_{n3}$).

Figure 10B:
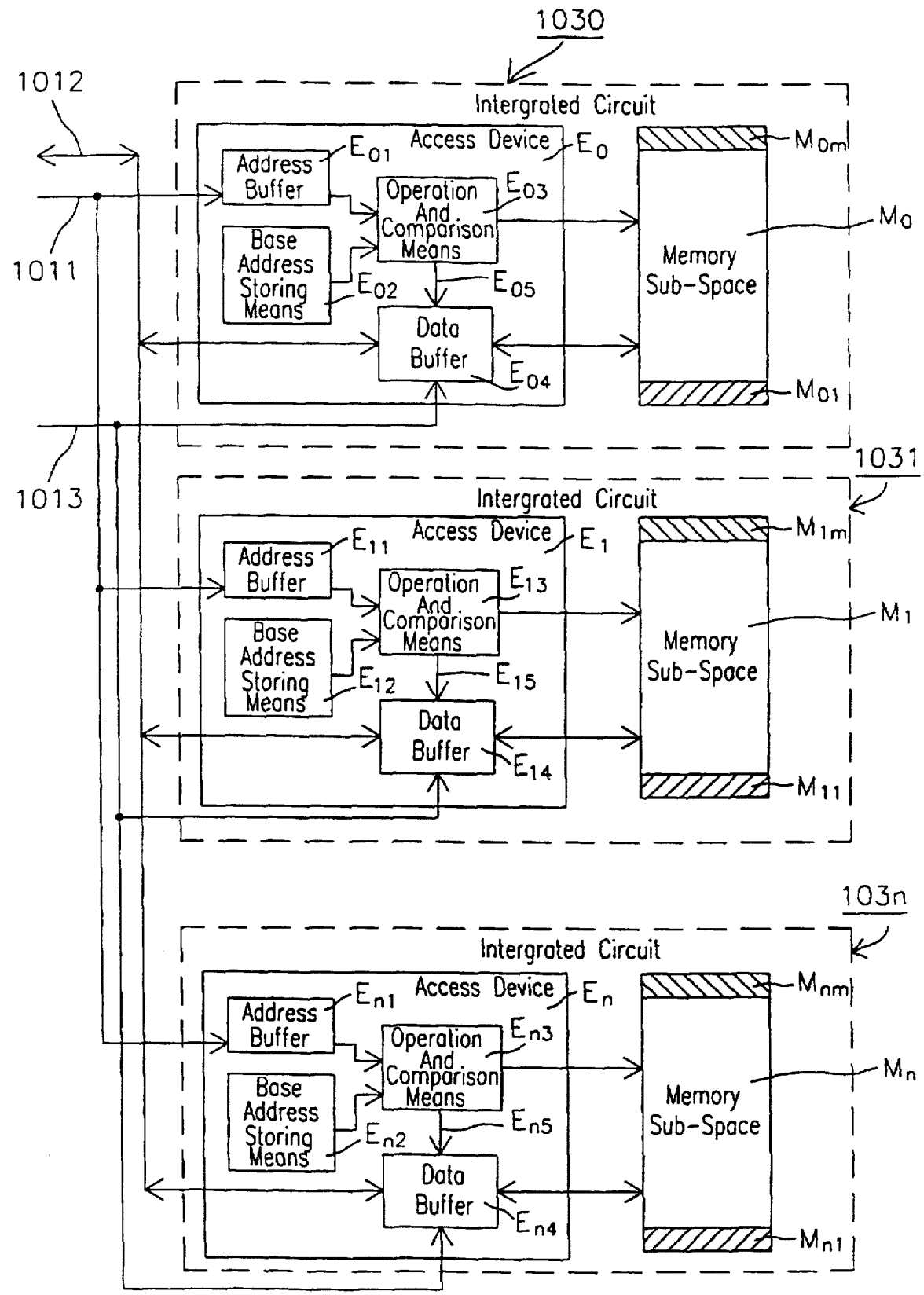
FIG. 10(b) is a schematic view showing a device in FIG. 10(a) having the access device and the corresponding memory sub-space formed into the same IC.

Preferably access devices $E_0-E_n$ are respectively formed with memory sub-spaces $M_0-M_n$ into the same IC 1030 (or 1031 ... or $103_n$) as shown in FIG. 10(b). The working principle of the present invention will be described by means of access device $E_0$ having base address storing means $E_{02}$ pre-stored with a base address through a high voltage. After address buffer $E_{01}$ has outputted the access address inputted from access address end 1011 to operation and comparison means $E_{03}$, operation and comparison means $E_{03}$ will operate the access address with the base address to obtain an operated result and will output the operated result to memory sub-space $M_0$ and generate a data access enabling signal $E_{05}$ to data buffer $E_{04}$ when the operated result falls within an address range in order that data buffer $E_{04}$ can gain for data access end 1012 access to memory sub-space $M_0$ in response to data access enabling signal $E_{05}$ and the access selection signal inputted from access selection end 1013. The operated result falls within the address range if the operated subtraction result is not small than initial address $M_{01}$ and not larger than the final address $M_{0m}$ of memory sub-space $M_0$.

Figure 11A:
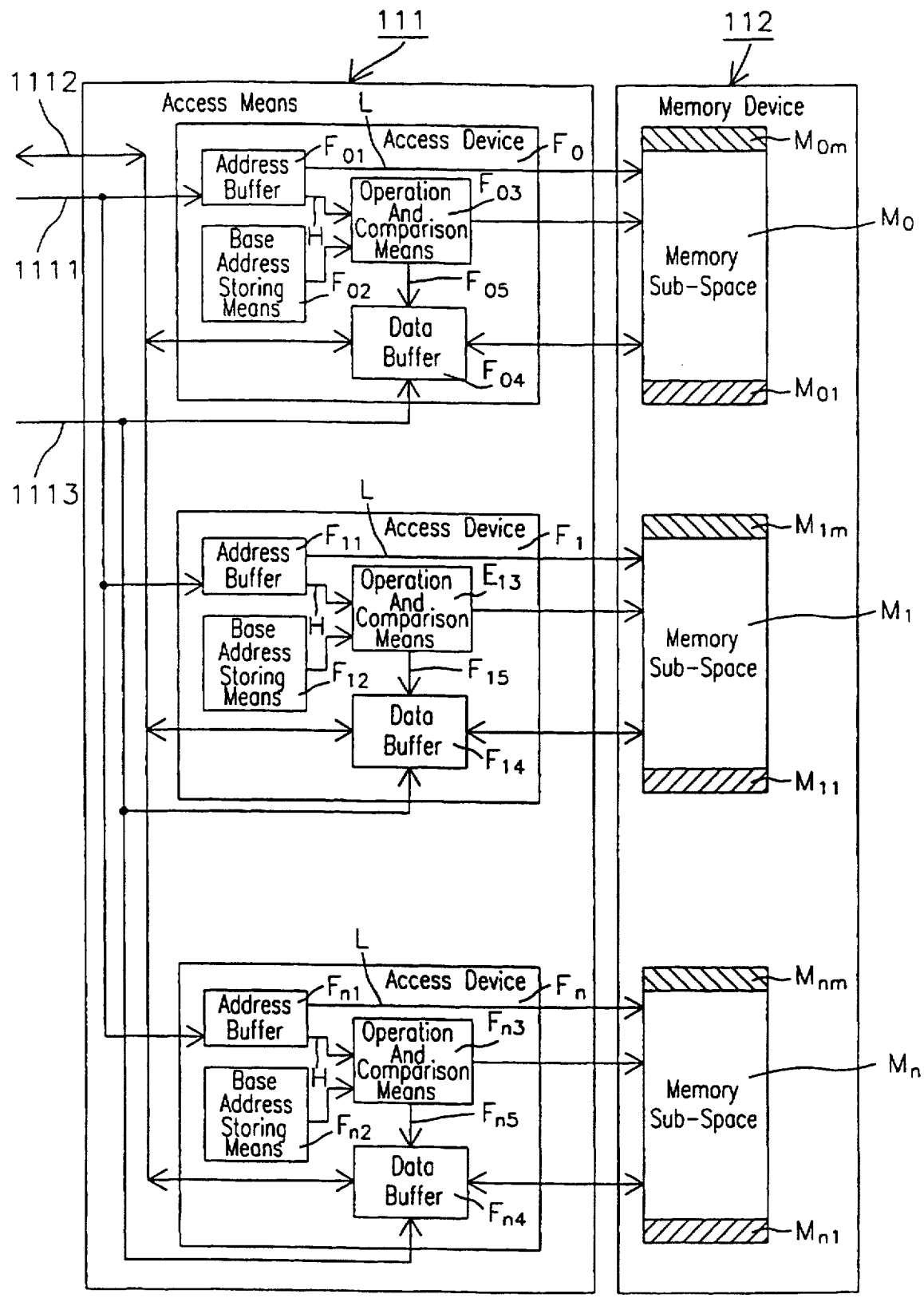
FIG. 11(a) is a schematic view showing a second preferred embodiment of a memory accessing device according to the present invention.
Figure 11B:
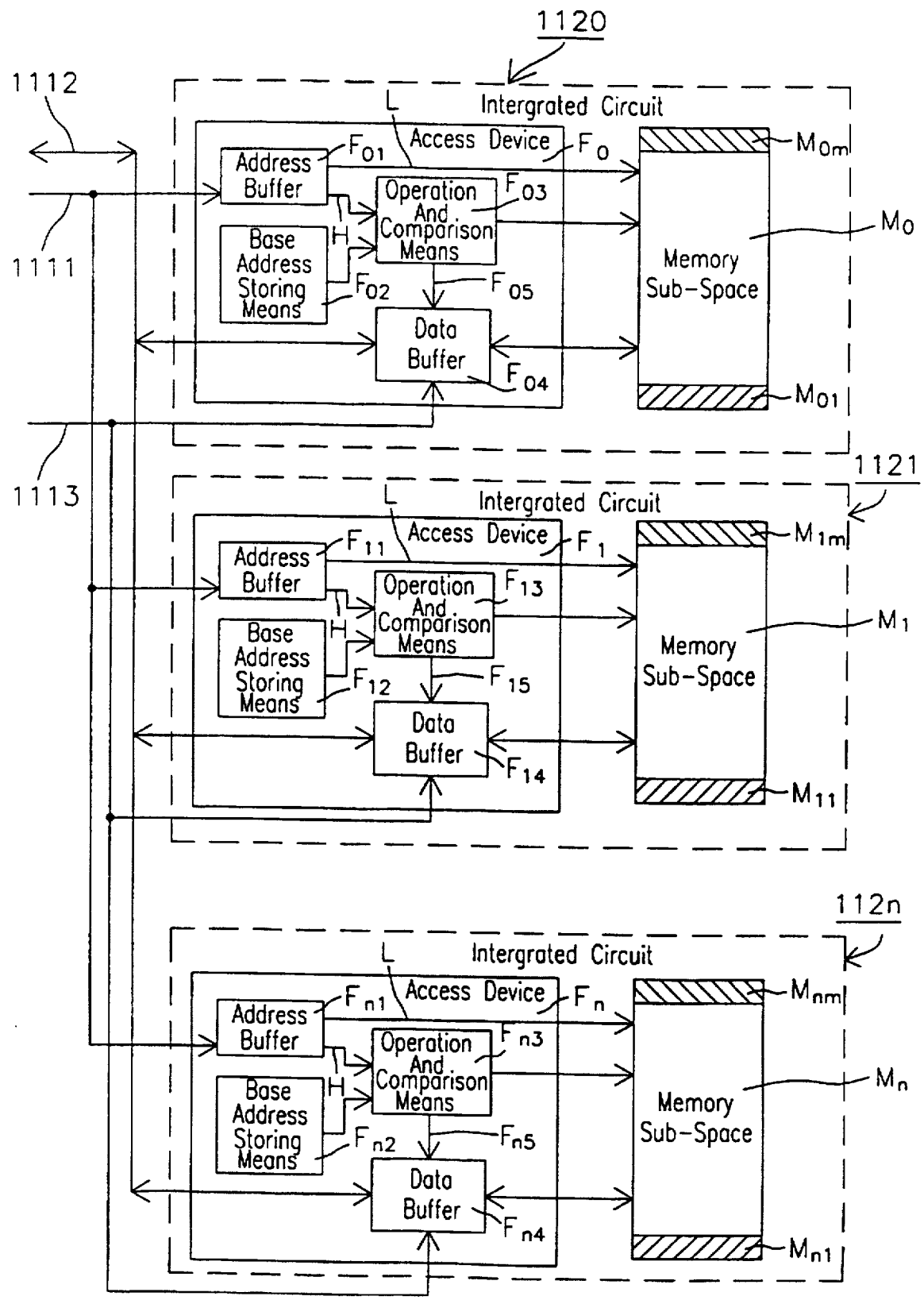
FIG. 11(b) is a schematic view showing a device in FIG. 11(a) having the access device and the corresponding memory sub-space formed into the same IC.

In order to simplify the circuit of operation and comparison means $E_{03}-E_{n3}$ and to accelerate their operation speed, another preferred embodiment of a memory accessing device is disclosed in FIG. 11(a) and similarly includes an access address end 1111, a data access end 1112, an access selection end 1113, an access means 111 having access devices $F_0-F_n$ respectively having address buffers $F_{01}-F_{n1}$, base address storing means $F_{02}-F_{n2}$, operation and comparison means $F_{03}-F_{n3}$ and data buffers $F_{04}-F_{n4}$, and a memory device 102 the same to FIG. 10(a). The most distinguishing feature of this embodiment resides in that address buffer $F_{01}$ (or $F_{11} \ldots$ or $F_{n1}$) first receives the access address from access address end 1111 and then outputs the access address which includes a high-bit and a low-bit addresses where the low-bit address is outputted to respective memory space $M_0$ (or $M_1 \ldots$ or $M_n$) and the high-bit address to operation and comparison means $F_{03}$ (or $F_{13} \ldots$ or $F_{n3}$). The relevant address range in this alternative covers high-bit address limits being initial and final high-bit addresses of respective memory sub-space $M_0$ (or $M_1 \ldots$ or $M_3$), which is accessed when the operated result falls in the address range when the operated result has a value not smaller than that of the initial high-bit address and not larger than that of the final high-bit address. Similarly, access devices $F_0-F_n$ can respectively be formed with memory sub-spaces $M_0-M_n$ into the same ICs1120–112n as shown in FIG. 11(b).

The working principle of the present invention will be further described with reference to FIGS. 12 & 13 respectively corresponding to FIGS. 10(b) & 11(b) in the following.

Figure 12:
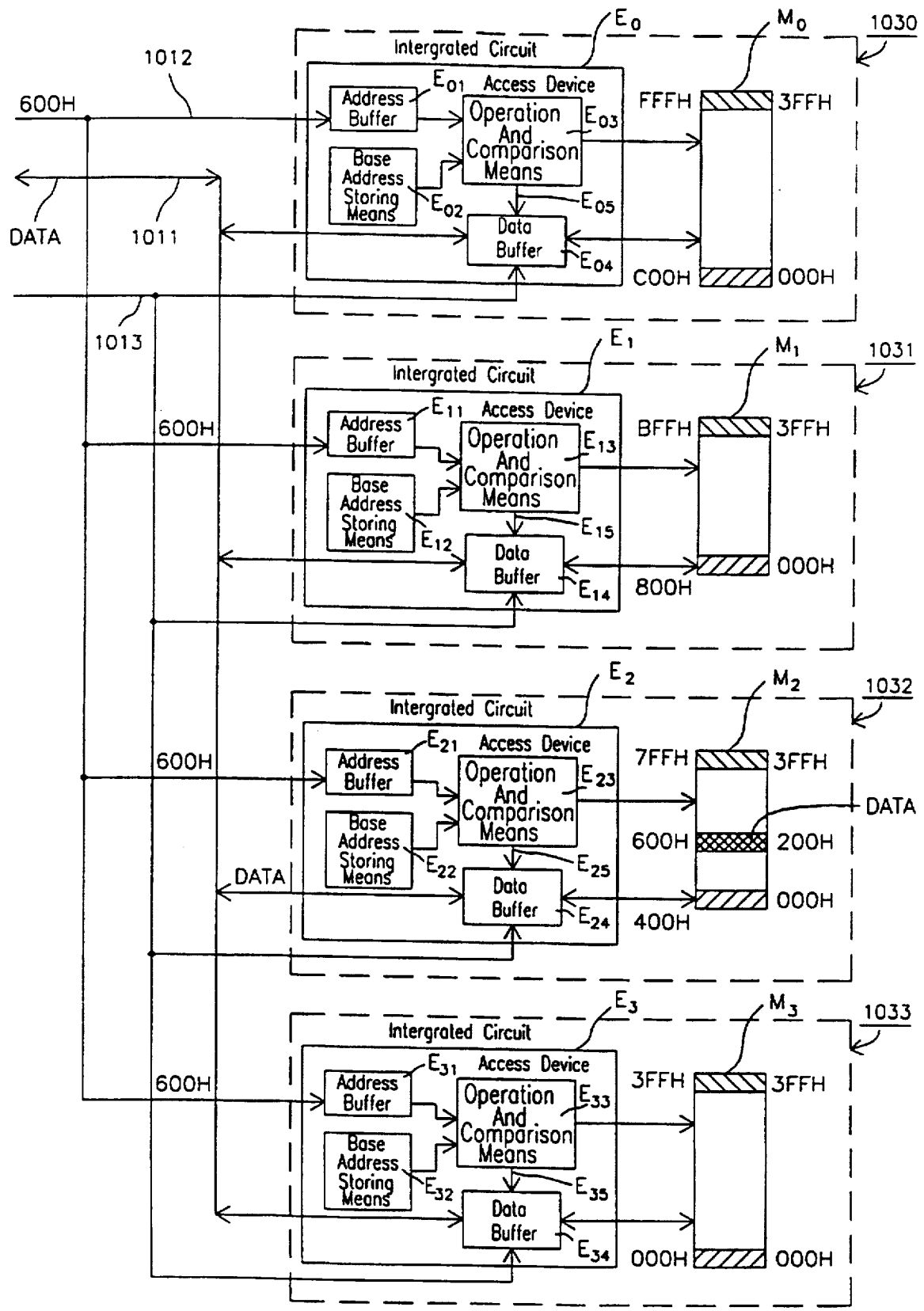
FIG. 12 is a schematic view showing an application of the present memory accessing device expanded to a 4K bytes memory space and based on a structure shown in FIG. 10(b)

Referring now to FIG. 12, if the access means includes 4 access devices $E_0-E_4$ and each memory sub-space $M_0$ (or $M_1 \ldots$ or $M_4$) has 1K bytes capacity, the relative address of memory sub-space $M_0$ (or $M_1 \ldots$ or $M_4$) is depicted on the right side thereof as 000H-3FFH and the absolute address of memory sub-space $M_0$ (or $M_1 \ldots$ or $M_4$) is depicted on the left side thereof as 000H-FFFH. Thus, base addresses 000H, 400H, 800H and C00H respectively corresponding to memory sub-spaces $M_0-M_4$ will be inputted into base address storing means $E_{02}-E_{32}$. If an access address 600H is inputted from access address 1012, operation and comparison means $E_{03}-E_{33}$ will operate as follows:

a) In IC 1033 600H (access address)−000H (base address of base address storing means $E_{32}$=600H which is larger than the capacity (000H-3FFH, 1K bytes) of memory sub-space $M_3$ so that the data access enabling signal $E_{35}$ is not enabled and memory sub-space $M_3$ cannot be accessed.

b) In IC 1032 600H−400H=200H which falls within the address range (1K bytes) of memory sub-space $M_2$ so that the data access enabling signal $E_{25}$ is enabled and memory sub-space $M_2$ is accessed at the place having an address corresponding to access address 600H.

c) In IC 1031 600H−800H=−200H which is an illegal operated result so that the data access enabling signal $E_{15}$ is not enabled and memory sub-space $M_1$ cannot be accessed.

d) In IC 1030 600H−C00H=−600H which is an illegal operated result so that the data access enabling signal $E_{05}$ is not enabled and memory sub-space $M_0$ cannot be accessed.

Figure 13:
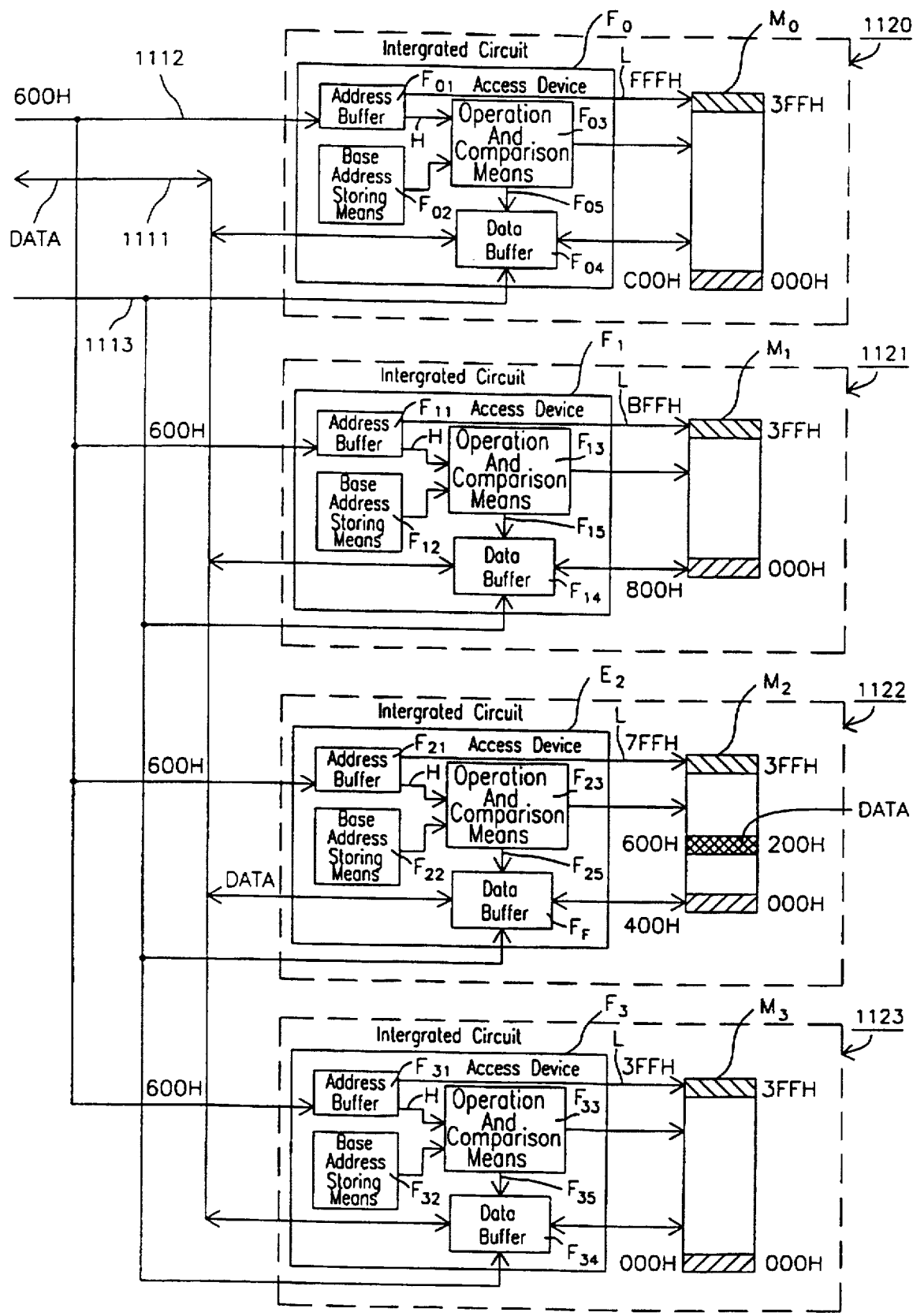
FIG. 13 is a schematic view showing an application of the present memory accessing device expanded to a 4K bytes memory space and based on a structure shown in FIG. 11(b).

Referring now to FIG. 13, if access means 111 includes 4 access devices $F_0$–$F_3$ and each memory sub-space $M_0$–$M_3$ has 1K bytes capacity, we can depict the relative address 000H-3FFH of each memory sub-space $M_0$–$M_3$ on the right side thereof and the absolute address 000H- FFFH on the left side thereof. Since memory sub-spaces $M_0$–$M_3$ have totally 4K bytes amounting to 12 bits, the high-bit address of the access address will be 4 bits if we set the low-bit address of the access address to be 8 bits. Each of address buffers $F_{01-F31}$ includes therein two registers for respectively transmitting therethrough the high-bit and the low-bit addresses. Thus, the high-bit base addresses 0H, 4H, 8H and CH respectively corresponding to memory sub-spaces $M_0$–$M_3$ are pre-stored in base address storing means $F_{02}$–$F_{32}$ respectively.

If an access address 600H is inputted from access address end 1112, address buffers $F_{01}$–$F_{31}$ will all have low-bit address 00H to be respectively outputted to memory sub-spaces $M_0$–$M_3$ and have high-bit address 6H. Accordingly, operation and comparison means $F_{03}$–$F_{33}$ will respectively operate as follows:

a) In IC 1123 6H (high-bit access address)−0H (high-bit base address in high-bit base address storing means $F_{32}$)=6H which is larger than the high-bit address range (0H–3H) of memory sub-space $M_3$ so that the data access enabling signal $F_{35}$ is not enabled and memory sub-space $M_3$ cannot be accessed.

b) In IC 1122 6H−4H (high-bit base address in high-bit base address storing means $F_{22}$) =2H which falls within the high-bit address range (0H–3H) of memory sub-space $M_2$ so that the data access enabling signal $F_{25}$ is enabled and memory sub-space $M_2$ will be accessed at the point having an address corresponding to address 200H being the composition of the high-bit address 2H and the low-bit address 00H.

c) In IC 1121 6H−8H=−2H which is illegal so that data access enabling signal $F_{15}$ will not be enabled and memory sub-space $M_1$ cannot be accessed.

d) In IC 1120 6H−CH=−6H which is illegal so that data access enabling signal F05 is not enabled and memory sub-space M0 cannot be accessed.

It is to be noticed that the present invention can be applied to all kinds of memories including ROM and RAM, especially to EPROM, EEPROM, and Flash Memory. The base address in the present invention can be freely determined by a user. Furthermore, the present invention can be used in a non-memory application having the same-address interfaces. While the invention has been described in terms of what are considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and equivalent structures.

What we claim is:

1. A memory accessing device comprising:

an access address end adapted to be electronically connected to a central processing unit (CPU) for inputting there through an access address;

a data access end adapted to be electrically connected to said CPU;

an access selection end adapted to be electronically connected to said CPU for inputting there through an access selection signal;

a memory device having a plurality of memory sub-spaces formed in a plurality of ICs respectively, wherein said memory accessing device further comprises an access means electrically connected to said access address end, said data access end, said accesses selection end and said memory device; said access means including a plurality of access devices, each of said access devices being former with a corresponding one of said plurality of memory sub-spaces in a corresponding one of said ICs and pre-stored therein with a corresponding one of a plurality of base addressees assigned to said memory sub-spaces respectively for determining which one of said memory sub-spaces should be accessed when an address is inputted from said access address end;

each of said access devices further including:

a base address storing means for storing therein said corresponding one of said plurality of base addressees;

an operation and comparison means electrically connected to said base address storing means, said access address end and said respective memory sub-space for operating said access address with said corresponding one of said plurality of base addresses to obtain an operated result and generating a data access enabling signal when said operated result falls within an address range;

a data buffer electronically connected to said operating and comparison means said respective memory sub-space, said data access end and said access selection end for accessing said respective memory sub-space in response to said data access enabling signal and said access selection signal;

said access address including high-bit and low-bit addresses and said each access device further including an address buffer electrically connected to said access address end, said operating and comparing means and said respective memory sub-space for first receiving said access address, and then outputting said low-bit address to said respective memory space and said high-bit address to said operating and comparing means; and said address buffer further including two registers for respectively transmitting there through said low-bit and high-bit addresses.

2. A device according to claim 1 wherein said base address storing means is a base address register.

3. A device according to claim 1 wherein an operation executed by said operation and comparison means is a subtraction.

4. A device according to claim 1 wherein said address range covers address limits respectively being initial and final addresses of said respective memory sub-space.

5. A device according to claim 4 wherein said operated result will fall within said address range when said operated result has a value not smaller than that of said initial address and not larger than that of said final address.

6. A device according to claim 1 wherein said data buffer is a bidirectional data buffer.

7. A device according to claim 1, wherein each of said access devices further includes an address buffer electrically connected to said access address end and said operation and comparison means for first receiving said access address and then outputting said access address to said operation and comparison means.

8. A memory accessing device comprising:

an access address end adapted to be electrically connected to a central processing unit (CPU) for inputting there through an access address;

a data access end adapted to be electrically connected to said CPU;

an access selection end adapted to be electrically connected to said CPU for inputting there through an access selection signal;

a memory device having a plurality of memory sub-spaces formed in a plurality of ICs respectively, wherein said memory accessing device further comprises an access means electrically connected to said access address end, said data access end, an accesses selection end and said memory device; said access means including a plurality of access devices, each of said access devices being formed with a corresponding one of said plurality of memory sub-spaces in a corresponding one of said ICs and pre-stored therein with a corresponding one of a plurality of base addresses assigned to said memory sub-spaces respectively for determining which one of said memory sub-spaces should be accessed when an address is inputted from said access address end;

each of said access devices including:

a base address storing means for storing therein said corresponding one of said plurality of base addresses;

an operation and comparison means electrically connected to said base address storing means, said access address end and said respective memory sub-space for operating said access address with said corresponding one of said plurality of base addresses to obtain an operated result and generating a data access enabling signal when said operated result falls within an address range;

a data buffer electronically connected to said operation and comparison means, said respective memory sub-space, said data access end and said access selection end for accessing said respective memory sub-space in response to said data access enabling signal and said access selection signal;

said access address including high-bit and low-bit addresses and said each access device further including an address buffer electrically connected to said access address end, said operating and comparing means and said respective memory sub-space for first receiving said accesses address, and then outputting said low-bit address to said respective memory space and said high-bit address to said operating and comparing means; and said address range covers high-bit address limits being initial and final high-bit addresses of said respective memory sub-space.

9. A device according to claim 8 wherein said operated result falls in said address range when said operated result has a value not smaller than that of said initial high-bit address and not larger than that of said final high-bit address.

10. A method for accessing a memory device comprising:

(a) Electronically connecting an access address end of said memory device to a central processing unit (CPU) for inputting there through an access address;

(b) Electronically coupling a data access end of said memory device to said CPU;

(c) providing said memory device with an access selection end coupled to said CPU for inputting there through an access selection signal;

said memory device having a plurality of memory sub-spaces formed in a plurality of ICs respectively, wherein said memory accessing device further comprises an access means electrically connected to said access address end, said data access end, said accesses selection end and said memory device; said access means including a plurality of access devices, each of said access devices being formed with a corresponding one of said plurality of memory sub-spaces in a corresponding one of said ICs and pre-stored therein with a corresponding one of a plurality of base addressees assigned to said memory sub-spaces respectively for determining which one of said memory sub-spaces should be accessed when an address is inputted from said access address end;

each of said access devices further including:

a base address storing means for storing therein said corresponding one of said plurality of base addresses;

an operation and comparison means electrically connected to said base address storing means, said access address end and said respective memory sub-space for operating said access address with said corresponding one of said plurality of base addresses to obtain an operated result and generating a data access enabling signal when said operated result falls within an address range;

a data buffer electronically connected to said operating and comparison means, said respective memory sub-space, said data access end and said access selection end for accessing said respective memory sub-space in response to said data access enabling signal and said access selection signal;

said access address including high-bit and low-bit addresses and said each access device further including an address buffer electrically connected to said access address end, said operating and comparing means and said respective memory sub-space for first receiving said access address, and then outputting said low-bit address to said respective memory space and said high-bit address to said operating and comparing means; and said address buffer further including two registers for respectively transmitting there through said low-bit and high-bit addresses.

11. A method according to claim 10 wherein said memory sub-spaces are equal in size.

12. A method according to claim 10 wherein said memory sub-spaces are not equal in size.

13. A method according to claim 10 wherein one of said base addresses is a starting address of said memory device.

14. A method according to claim 10 wherein one of said base addresses corresponding to a specific one of said memory sub-spaces has a value equal to a sum of the value of a respective one of said base addresses corresponding to said respective memory sub-space preceding said one specific memory sub-space and the value of said respective address range corresponding to said preceding memory sub-space.

15. A method according to claim 10 wherein said operated results are obtained by respectively subtracting said base addresses from said access address.

16. A method according to claim 10 wherein said operated result falls within said one address range responsive to said specific one operated result having a value which is not less than the address of said respective base address corresponding to said one memory sub-space and which is not larger than a sum of said respective base address and said one address range.

* * * * *